(12) United States Patent
Lee (10) Patent No.: US 9,379,031 B2
(45) Date of Patent: Jun. 28, 2016

(54) DISPLAY PANEL FOR DISPLAY DEVICE

(71) Applicant: LG Display Co., Ltd., Seoul (KR)

(72) Inventor: SangBin Lee, Gyeongsangbuk-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/548,504

(22) Filed: Nov. 20, 2014

(65) Prior Publication Data

US 2015/0144915 A1 May 28, 2015

(30) Foreign Application Priority Data

Nov. 28, 2013 (KR) .................. 10-2013-0145880

(51) Int. Cl.
*H01L 27/32* (2006.01)
*H01L 21/66* (2006.01)
*G09G 3/00* (2006.01)
*G02F 1/13* (2006.01)
*G02F 1/1345* (2006.01)
*G02F 1/1362* (2006.01)
*H01L 21/00* (2006.01)

(52) U.S. Cl.
CPC .............. *H01L 22/32* (2013.01); *G02F 1/1309* (2013.01); *G02F 1/1345* (2013.01); *G02F 1/136204* (2013.01); *G09G 3/006* (2013.01); *H01L 27/3276* (2013.01); *G02F 2001/13629* (2013.01); *G02F 2001/136254* (2013.01)

(58) Field of Classification Search
None
See application file for complete search history.

(56) References Cited

U.S. PATENT DOCUMENTS

| | | | | |
|---|---|---|---|---|
| 6,734,925 B1* | 5/2004 | Lee | ............ | G02F 1/1345 349/40 |
| 7,576,807 B2* | 8/2009 | Chen | ............ | G02F 1/1309 349/40 |
| 7,847,910 B2* | 12/2010 | Miyakawa | ........ | G02F 1/133555 349/151 |
| 8,367,444 B2* | 2/2013 | Kim | .............. | H01L 27/1214 257/E21.409 |
| 2002/0027621 A1* | 3/2002 | Chae | ............ | G02F 1/13458 349/40 |
| 2003/0117536 A1* | 6/2003 | Jeon | ............ | G02F 1/136286 349/40 |
| 2008/0198284 A1* | 8/2008 | Oyamada | ........ | G02F 1/136213 349/39 |
| 2008/0284969 A1* | 11/2008 | Lim | ............ | G02F 1/13458 349/152 |
| 2009/0244429 A1* | 10/2009 | Chung | ......... | G02F 1/1345 349/56 |
| 2009/0294771 A1 | 12/2009 | Kim et al. | | |
| 2010/0109993 A1 | 5/2010 | Chang | | |
| 2011/0080173 A1* | 4/2011 | Kim | ............ | G09G 3/006 324/403 |
| 2012/0146085 A1* | 6/2012 | Park | ............ | H01L 27/124 257/99 |
| 2014/0319471 A1* | 10/2014 | Kim | ............ | H01L 22/32 257/40 |
| 2014/0353666 A1* | 12/2014 | Lee | ............ | H01L 22/32 257/59 |
| 2015/0008432 A1* | 1/2015 | Kim | ............ | H01L 27/124 257/48 |
| 2015/0162251 A1* | 6/2015 | Jeong | ............ | H01L 22/32 257/48 |
| 2015/0255527 A1* | 9/2015 | Oooka | ............ | H01L 22/14 257/88 |

* cited by examiner

*Primary Examiner* — Evren Seven
(74) *Attorney, Agent, or Firm* — Morgan, Lewis & Bockius LLP (57) ABSTRACT

Disclosed is a display panel in which a jumping wiring made of a heterogeneous material for the prevention of static electricity connects a signal pad with a test wiring of an array substrate, or a display panel, and induces a discharge of the static electricity when the static electricity generated in an array test process flows into the display panel, thereby preventing damage to the display panel.

12 Claims, 8 Drawing Sheets

DISPLAY PANEL FOR DISPLAY DEVICE

CROSS-REFERENCE TO RELATED APPLICATION

This application claims priority from Korean Patent Application No. 10-2013-0145880, filed on Nov. 28, 2013, which is hereby incorporated by reference for all purposes as if fully set forth herein.

BACKGROUND OF THE INVENTION

1. Field of the Invention

The present invention relates to a display panel for a display device, and more particularly, to a display panel and a method of fabricating the same, which is capable of preventing the damage of a substrate due to static electricity generated on the panel in an array test process.

2. Description of the Prior Art

With the development of information society, various types of requirements for a display device for displaying an image are increasing and, recently, various display devices, such as a Liquid Crystal Display (LCD), a Plasma Display Panel (PDP), and an Organic Light Emitting Diode Display Device (OLED), are being used.

The liquid crystal display among the display devices includes an array substrate including a thin film transistor, an upper substrate having a color filter and/or a black matrix, and a liquid crystal layer interposed between the array substrate and the upper substrate. The liquid crystal display is a device in which an arranged status of the liquid crystal is controlled depending on an electric field applied between two electrodes of a pixel area, thereby adjusting permeability of light to display an image.

Further, the OLED display device includes a thin film transistor, such as a switching transistor and a driving transistor, first and second electrodes, a first substrate including an organic light emitting layer arranged between the first and second electrodes, and a second substrate adhered onto the first substrate. The OLED display device is a device in which the extent of light emitting of the organic material is controlled depending on a magnitude of a voltage or an electric current applied between two electrodes of a pixel area.

Figure 1:
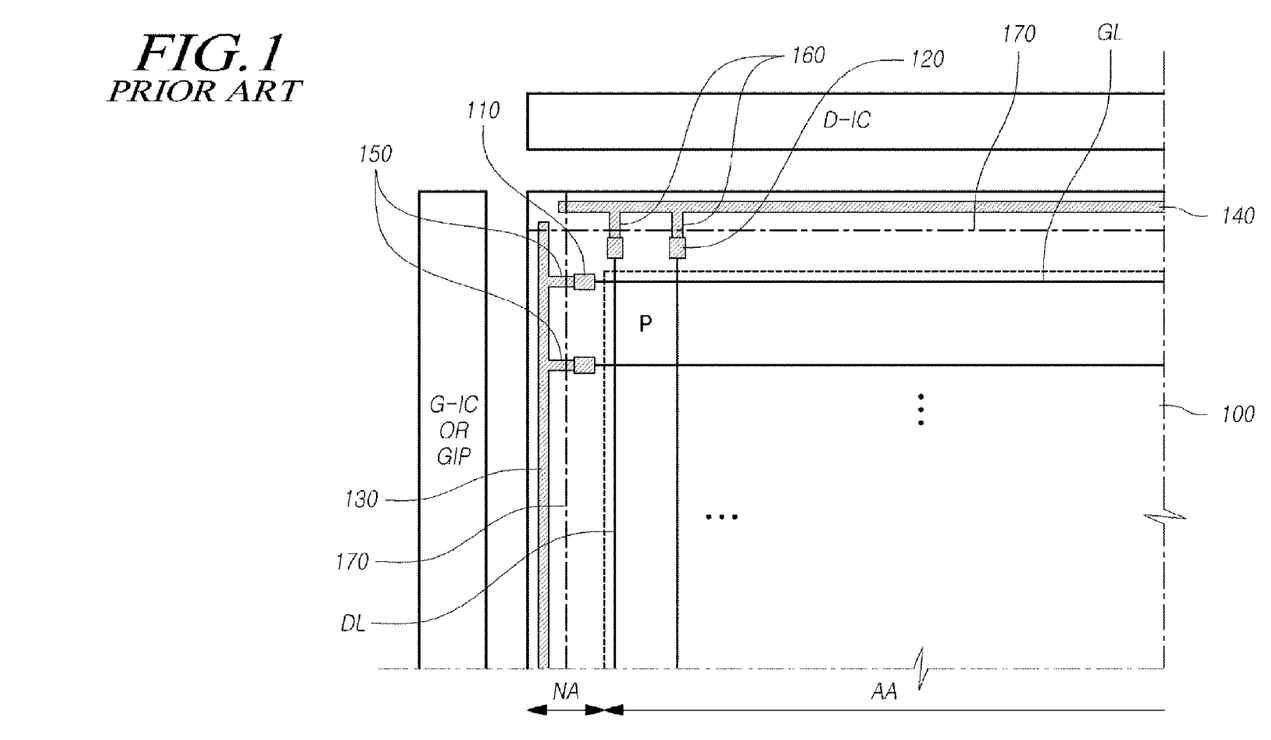
FIG. 1 is a view schematically illustrating a plane of an array substrate or a display panel for a related art display device.

FIG. 1 shows an example of a display panel or an array substrate of a related art display device.

A display panel 100 for the liquid crystal display device or the OLED display device has an active area AA for providing an image to a user, and a non-active area NA, which is a peripheral area of the active area AA. The display panel is fabricated by adhering the first substrate, which is the array substrate in which the thin film transistor and the like are formed to define a pixel area, to the second substrate which is an upper substrate in which a black matrix and/or a color filter layer are formed.

In the case of the OLED display panel, the second substrate may only function as a protection substrate.

The array substrate or the first substrate on which the thin film transistor is formed includes a plurality of gate lines GL extending in a first direction, and a plurality of data lines DL extending in a second direction perpendicular to the first direction. Each gate line and each data line define one pixel area P. One or more thin film transistors are formed in one pixel area P, and a gate electrode and a source electrode of each thin film transistor may be connected to a gate line and a data line, respectively.

Further, a gate pad 110 is formed at an end of each gate line GL as a signal pad for applying a gate signal. In FIG. 1, a gate pad (not shown) may be additionally formed at a right side in addition to a gate pad 110 formed at a left side.

Further, a data pad 120 is formed at an upper portion or a lower portion of the display panel 100 as a signal pad for applying a data signal to an end of each data line DL.

On the other hand, an array test process is performed to test whether a defect (for example, a point defect such as a fault of a transistor or a line defect such as a short) in an electrical property of the panel is present after a process of fabricating the array substrate is complete. For the array test, test wirings extend longitudinally in both directions of a display panel in order to simultaneously apply a test signal to all gate pads and/or data pads.

That is, as shown in FIG. 1, a test wiring 140 for data lines simultaneously connecting a plurality of data pads 120 longitudinally extends in the first direction substantially parallel to the gate lines, and a test wiring 130 for gate lines simultaneously connecting a plurality of gate pads 110 longitudinally extends in the second direction substantially parallel to the data lines.

Further, the test wirings 130 and 140 and each pad are connected by connection wirings 150 and 160, which are formed of a metal material identical to that of the pads on an identical layer as that of the pads or on different layers than that of the pads.

When an array test is complete through the test wiring after fabricating the array substrate or the display panel, the display panel is cut along a cutting line 170, thereby completing a process of fabricating the individual display panel.

On the other hand, static electricity may be generated in the process of the array test, and at this time a large voltage or electric current may be momentarily applied. Since the above-mentioned test wirings 150 and 160 are formed longitudinally as a single metal wire, they have a large amount of electric charge. Accordingly, electric charges caused by the static electricity flow into the panel through the test wiring and the connection wiring so as to cause breakdown of internal wirings of the thin film transistor or the panel, thereby causing a defect of the panel.

That is, since the related art test wiring and connection wiring for the array test are formed of a metal pattern identical to the data pad or the gate pad, and have the large amount of electric charge, there is a problem in that static electricity generated in the array test process flows into the panel, thereby causing damage of the panel.

SUMMARY OF THE INVENTION

Accordingly, the present invention is directed to a display panel that substantially obviates one or more of the problems due to limitations and disadvantages of the related art.

An object of the present invention is to provide a display panel which is capable of preventing damage thereof due to static electricity generated in an array test.

Another object of the present invention is to provide a display panel which is capable of preventing an inflow of static electricity into the display panel or an array substrate in a process of testing the array substrate.

Still another object of the present invention is to provide a display panel in which a jumping wiring made of a heterogeneous material for a prevention of static electricity is connected between a signal pad and a test wiring of an array substrate or a display panel, and induces a discharge of the static electricity when the static electricity generated in a process of testing a substrate flows into the display panel, thereby preventing damage of the display panel which is caused by the static electricity which is generated in the test process and flows into the display panel.

Yet another object of the present invention is to prevent defects of a display panel due to the static electricity generated in the array test process of the display panel for the liquid crystal display device or the organic light emitting display device.

A further object of the present invention is to provide a connection of a jumping wiring that induces a breakdown of static electricity when static electricity generated in the substrate test process flows into the display panel, thereby preventing the damage or defect of the inside of the panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display panel comprises a plurality of gate lines and data lines; an active area having a plurality of pixels, each of which is defined at an intersection area between a respective gate line and data line, a plurality of signal pads arranged in a non-active area, each signal pad configured so as to apply a gate signal or a data signal to a respective gate line or data line, and a test wiring portion arranged out of a cutting line of the display panel and electrically connected to the plurality of signal pads in order to be used in a test of the display panel; a plurality of jumping wirings, each jumping wiring being interposed between a respective signal pad and the test wiring portion and electrically connecting the signal pad with the test wiring portion, the jumping wirings being formed of a material different from that of the signal pads and the test wiring portion on a layer different from that of the signal pads and the test wiring portion.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 2, 3 and 4 are views illustrating a configuration of a first embodiment, in which

FIGS. 5, 6 and 7 are views illustrating a configuration of a second embodiment, in which

DETAILED DESCRIPTION OF THE EXEMPLARY EMBODIMENTS

Hereinafter, exemplary embodiments will be described with reference to the accompanying drawings. In the following description, the same elements will be designated by the same reference numerals although they are shown in different drawings. Further, in the following description of the present invention, a detailed description of known functions and configurations incorporated herein will be omitted when it may not be required for the understanding of the subject matter of this invention.

In addition, terms, such as first, second, A, B, (a), (b) or the like may be used herein when describing components of this invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "interposed" between the first and second components, although the first component may be directly "connected", "coupled" or "joined" to the second component.

This invention is to solve the problems in which the static electricity generated in an array test process flows into the panel through the test wiring, connection wiring and signal pad and damages the elements in the display panel. For this purpose, in this invention, a jumping wiring formed of a material different from the test wiring and the signal pads is formed between the signal pad and the test wiring, which breaks down due to the heterogeneous material (in other words, different material) when static electricity generated in the array test process flows into the display panel, thereby preventing damages of the display panel due to static electricity.

For the purpose, two embodiments of the present invention will be described below as an example, but the present invention is not limited to these embodiments.

The first embodiment includes a jumping wiring formed of a material different from that of a signal pad and a test wiring portion on a layer different from that of the signal pad and the test wiring portion, which is interposed between a test wiring portion and a signal pad such as a gate pad or a data pad to electrically connect the signal pad to the test wiring portion.

Further, the second embodiment includes an additional connection wiring arranged between the signal pad portion and the test wiring portion, and a jumping wiring interposed between the signal pad portion and the connection wiring portion and/or between the test wiring portion and the connection wiring portion, in which the jumping wiring is formed of a material different from that of the signal pad portion, the test wiring portion, and the connection wiring portion on a layer different from that of the signal pad portion, the test wiring portion, and the connection wiring portion.

Hereinafter, in each description, "signal pad portion" refers to all kinds of metal patterns, which are electrically connected to a gate pad and a data pad and used to apply a gate signal and a data signal to a gate line and/or a data line of a display panel, as well as a gate pad disposed in a non-active area and the data pad.

Further, "test wiring portion" is a metal pattern which is arranged outside of a cutting line of the display panel and electrically connects a plurality of signal pads, and includes all kinds of wirings used to apply an inspection signal to an inside of the panel in order to perform various inspections after the fabrication of the display panel. The "test wiring" may be expressed by another term such as a test line, a shorting-bar, an auto probe test line, and the like.

Hereinafter, a configuration of the two embodiments will be described in detail with reference to the drawings.

Figure 2:
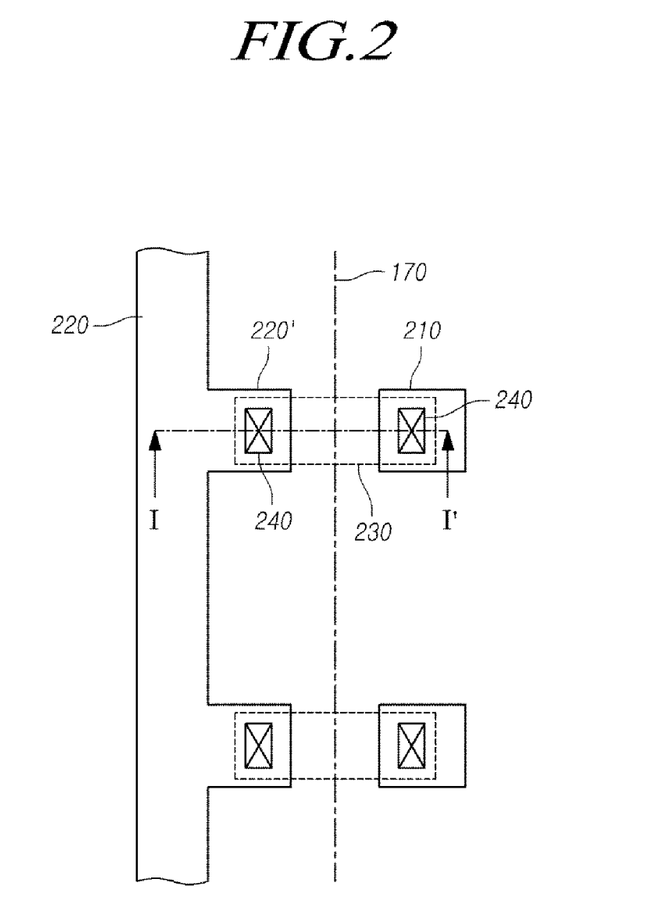
FIG. 2 is a plan view illustrating a test wiring portion on an array substrate according to the first embodiment.
Figure 3:
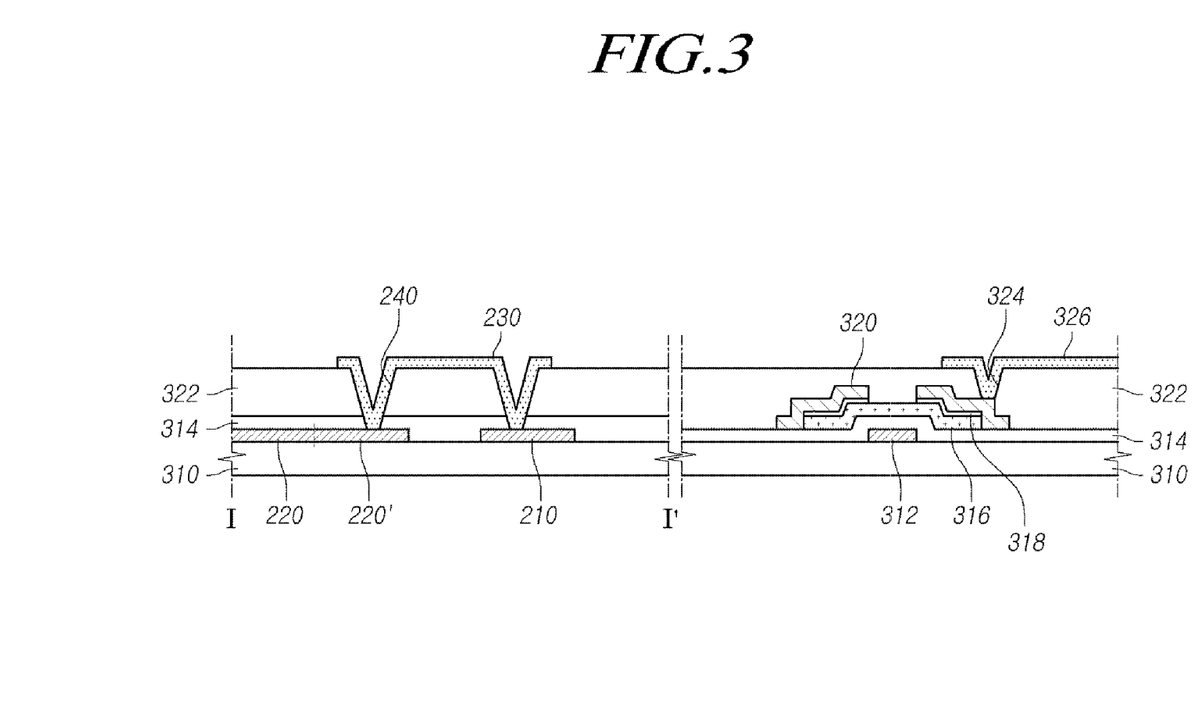
FIG. 3 is a sectional view illustrating the test wiring portion on the array substrate.
Figure 4:
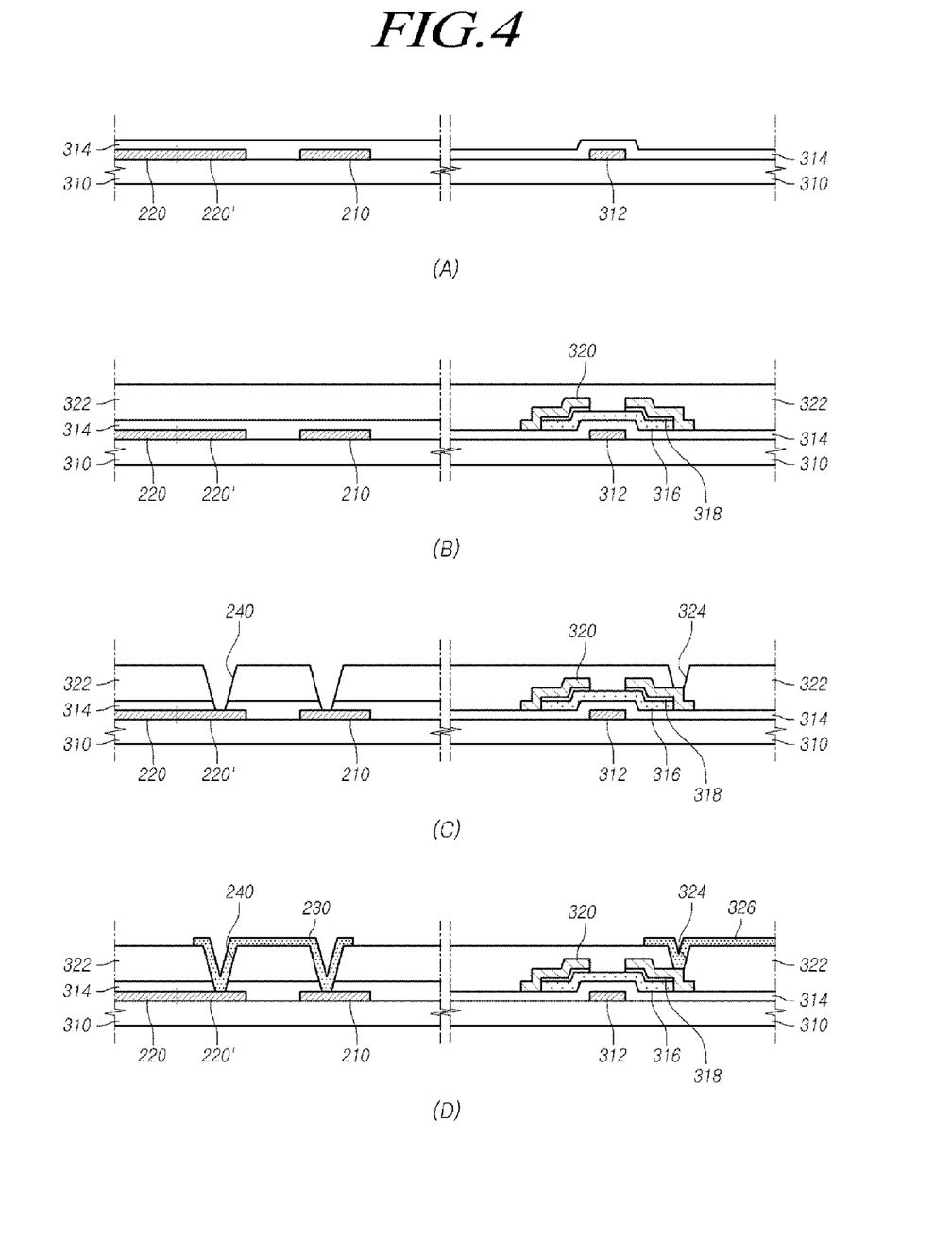
FIG. 4 is a view illustrating a fabricating process.

FIGS. 2, 3 and 4 are views illustrating a configuration of the first embodiment of the present invention, in which FIG. 2 is a plan view illustrating a test wiring portion on an array substrate according to the first embodiment of the present invention, FIG. 3 is a sectional view illustrating the test wiring portion on the array substrate, and FIG. 4 is a view illustrating a fabricating process.

As shown in FIG. 2, according to the first embodiment, the display panel, which includes (for example, similarly as illustrated in FIG. 1) an active area having a plurality of pixels, each of which is defined at an intersection area between a gate line and a data line, a signal pad 210 disposed in the non-active area, for applying a gate signal or a data signal to the gate line or the data line, and test wiring portions 220 and 220' disposed outside of a cutting line 170 and electrically connected to the signal pad in order to use in a test of a substrate, includes a jumping wiring 230 interposed between the signal pad 210 and the test wiring portions 220 and 220' and electrically connected to the signal pad and the test wiring portions. The jumping wiring 230 is formed of a material different from the signal pad and the test wiring portions on a layer different from that of the signal pad and the test wiring portions so as to prevent static electricity.

As shown in FIG. 2, it will be described that the test wiring portion includes a test wiring 220 as a primary wiring extending in a longitudinal or transverse direction of the panel and an inspection pad 220' extending from the primary wiring and connected to each signal pad. However, the test wiring portion is not limited thereto, and it is described below that the test wiring portion includes the test wiring 220 and the inspection pad 220' for convenience.

That is, in the first embodiment as shown in FIG. 2, the test wiring portions 220 and 220' and the signal pad 210 are configured of an identical material on the same layer, and the jumping wiring 230 to electrically connect the inspection pad 220' and the signal pad 210, which are exposed through a respective contact hole 240, may be formed of a material different from the test wiring portion and the signal pad on a layer different from the test wiring portion and the signal pad.

Especially, in the case where the signal pad and the test wiring portion are prepared for the inspection of a gate signal pad and a gate line, the signal pad 210 and the test wiring portions 220 and 220' are formed of a gate metal layer, and the jumping wiring 230 may be configured of a transparent electrode material identical to that of a pixel electrode and different from that of the gate metal layer.

Further, in the case where the signal pad and the test wiring portion are prepared for the inspection of a data signal pad and a data line, the signal pad 210 and the test wiring portions 220 and 220' are formed of a source/drain metal layer, and the jumping wiring 230 may be configured of the transparent electrode material identical to that of the pixel electrode and different from that of the source/drain metal layer.

The material of the gate metal layer or the source/drain metal layer which is identical to that of the signal pad and the test wiring portion may include one or more metal material having a low resistance property such as aluminum (Al), aluminum alloy such as aluminum neodym alloy (AlNd), copper (Cu), copper alloy, molybdenum (Mo), and molybdenum alloy such as molybdenum titanium alloy (MoTi).

Further, in the embodiment, the pixel electrode, which may be formed of a material of the jumping wiring, may be a transparent electrode. That is, the pixel electrode and the jumping wiring may be formed of a transparent conductive material having a relatively large work function value, for example, a metal oxide such as Indium Tin Oxide (ITO) or Indium Zinc Oxide (IZO), or a combination of a metal and an oxide such as ZnO:Al or SnO2:Sb.

As shown in FIGS. 2 and 3, on the other hand, the signal pad 210 and the inspection pad 220' may be formed to be a gate metal pattern, and a respective contact hole 240 is formed to penetrate a gate insulation layer 314 and a protection layer (passivation layer 322) which are sequentially formed on the signal pad 210 and the inspection pad 220', so as to expose a part of the signal pad 210 and the inspection pad 220'. Further, the jumping wiring 230 formed of a material of the pixel electrode may electrically connect the signal pad 210 with the inspection pad 220' through the contact hole.

On the other hand, the jumping wiring 230 may have a length equal to or longer than 500 μm.

FIG. 3 is a sectional view illustrating the test wiring portion according to the first embodiment of the present invention, taken along a line I-I' of FIG. 2, and shows a sectional view illustrating the test wiring portion along with a thin film transistor on a right side in order to help understanding.

As shown in a sectional view of FIG. 3 taken along the line I-I' on a left side of FIG. 3, the display panel or an array substrate according to the first embodiment includes the test wiring portions 220 and 220' and the signal pad 210 formed of a material identical to that of a gate electrode 312 of the thin film transistor in the same process as that of forming the gate electrode 312, and a respective contact hole 240 formed to expose an end of the inspection pad 220' and the signal pad 210 through a part of a gate insulation layer 314 and a protection layer 322 which are sequentially formed on the test wiring portions 220 and 220' and the signal pad 210. The display panel or the array substrate further includes a jumping wiring 230 which is formed of a material identical to that of a pixel electrode 326 in the thin film transistor area in the same process as that of forming the pixel electrode 326 and electrically connects the inspection pad 220' with the signal pad 210 through the contact holes 240.

According to the first embodiment, in the case where static electricity is generated in a process of inspecting the panel, such as an array test and the like, when an electric charge of static electricity reaches the jumping wiring 230 configured of a heterogeneous material (in other words, a material that is different from a material of the test wiring portions 220 and 220' and/or of the signal pad 210) while it is electrified through the test wiring portions 220 and 220', a movement of the electric charge is disturbed due to a difference of electric conductivity, and a connection of two materials is broken due to a difference of mobility of the electric charge so as to cause a phenomenon in which two materials are electrically short-circuited. Accordingly, it is possible to prevent an inflow of the static electricity into the panel through the test wiring portions.

Each layer in the thin film transistor area shown on a right side of FIG. 3 is merely shown in order to help the understanding of a process or a material of forming the signal wiring, according to the present invention.

A configuration (material, process, and the like) of each layer of the thin film transistor will be described in detail with reference to FIG. 4 illustrating a process of fabricating the display panel.

FIG. 4 is a sectional view illustrating a process of fabricating the display panel (array substrate) having a configuration of preventing static electricity according to the first embodiment of the present invention.

Firstly, a gate metal material composed of at least one or more metal material such as aluminum (Al), aluminum alloy such as aluminum neodym alloy (AlNd), copper (Cu), copper alloy, molybdenum (Mo), and molybdenum alloy such as molybdenum titanium alloy (MoTi), is deposited on a surface of a substrate such as a transparent insulation substrate 310 consisting of glass or plastic material to form a first metal layer. Next, the first metal layer is patterned by performing a masking process or a photolithography process including a series of processes of coating a photoresist, exposing the photoresist by using a photo-mask, developing the exposed photoresist, etching a part of the first metal layer, and stripping the photoresist, so as to form the test wiring portion 220, which has a single layer or multilayer configuration and extends in a longitudinal direction of the panel (in a direction parallel with the data line), the test wiring portion (inspection pad) 220', and the signal pad (e.g. gate pad) 210.

In the processes, the gate line (not shown) connected to each pixel area and a gate electrode 312 of a driving TFT or a pixel TFT may be simultaneously formed together (see step A of FIG. 4).

Next, after a mask having a transparent area is arranged in a necessary area, a first inorganic insulation substance, for example, any one of silicon oxide (SiO2) or silicon nitride (SiNx), is deposited to form a gate insulation layer 314 formed of the inorganic insulation substance.

The gate insulation layer 314 having a single layer is shown in FIG. 4, but it may have at least two layers consisting of different materials respectively.

Next, any one of Zinc Oxide based Oxide, e.g., Indium Gallium Zinc Oxide (IGZO), Zinc Tin Oxide (ZTO), and Zinc Indium Oxide (ZIO) is deposited or coated as an oxide semiconductor material on the gate insulation layer 314 to form an oxide semiconductor layer, and the oxide semiconductor layer (not shown) is patterned by performing a mask process to form an active layer or a semiconductor layer 316 in the form of an island on a gate electrode 312 of each thin film transistor (TFT).

The semiconductor layer 316 may also be formed of a poly-silicon, but it is not limited thereto. The semiconductor layer 316 may be formed of the oxide semiconductor or one of pure amorphous silicon and impure amorphous silicon.

In the case that the semiconductor layer 316 is formed of the poly silicon, after an amorphous silicon layer is formed on the substrate 310, the amorphous silicon layer is crystalized to form a poly crystal silicon layer, and then the poly crystal silicon layer is patterned to form the semiconductor layer 316. The amorphous silicon may be formed by using a chemical vapor deposition, or a physical vapor deposition. Further, when the amorphous silicon is formed, or after the amorphous silicon is formed, a dehydrogenation treatment of the amorphous silicon may be performed to lower a concentration of hydrogen. Further, the crystallization of the amorphous silicon layer may be performed by using any one of a rapid thermal annealing (RTA) process, a solid-phase crystallization (SPC) process, a metal induced crystallization (MIC) process, a metal induced lateral crystallization (MILC) process, a super grain silicon (SGS) process, an excimer laser crystallization (ELA) process, or a sequential lateral solidification (SLS) process.

Then, an ohmic contact layer 318 is formed on the semiconductor layer 316 in order to reduce a contact resistance, and a source/drain electrode 320 is formed on the ohmic contact layer 318. Particularly, after the semiconductor layer 316 and/or the ohmic contact layer 318 are formed, a source/drain metal layer consisting of a material, such as copper (Cu), chrome (Cr), molybdenum (Mo), titanium (Ti), tantalum (Ta), molybdenum alloy (Mo alloy), and the like, is deposited on a surface to form a second metal layer, and then the second metal layer is patterned by performing a mask process or a photolithographic process to form a source/drain electrode 320.

In the process, a data line (not shown) connected to each pixel area may be simultaneously formed together with the source/drain electrode 320.

An etch stopper, which has an island shape and consists of an inorganic insulation material, may be formed instead of, or in addition to, the ohmic contact layer 318, and then the source/drain metal layer may be patterned on the etch stopper, thereby forming a source electrode and a drain electrode contacting an upper surface of both ends of the semiconductor layer 316.

Further, during the patterning of the source/drain metal layer, a photoresist film having three thicknesses is formed as a single mask by using a half-tone mask process having a semi-transparent property at some areas so that the patterning of two layers may be performed by a single masking process.

Next, after the source/drain metal pattern is formed, a protection layer 322 or a passivation layer is formed on the source/drain metal pattern (see step B of FIG. 4).

Then, a contact hole 324 is formed to penetrate the protection layer 322 and to expose a part of the drain electrode in the thin film transistor area in order to connect the pixel electrode and the drain electrode. In this process, the masking process or the photolithographic process is performed to pattern the protection layer 322 or the passivation layer, and some area of the gate insulation layer 314 and the protection layer 322 is etched so as to form contact holes 240, which expose a part of an end of the inspection pad 220' and the signal pad 210 (see step C of FIG. 4), respectively.

In the process of forming the pixel electrode, the jumping wiring 230 is formed to connect the inspection pad 220' and the signal pad 210 through the contact holes 240, which may be formed of a material identical to that of the pixel electrode (see step D of FIG. 4). That is, the jumping wire 230 may be formed of a transparent conductive material having a relatively large work function value such as a metal oxide such as Indium-Tin-Oxide (ITO) and Indium-Zinc-Oxide (IZO), a combination of an oxide and a metal, such as ZnO:Al or SnO2:Sb, but it is not limited thereto.

Further, the embodiments of the present invention are not limited to a configuration of the thin film transistor shown in FIGS. 2 to 4. If the embodiments of the present invention include a configuration in which the test wiring portion and the signal pad are electrically connected by means of the jumping wiring formed of a material different from that of the test wiring and the signal pad on a layer different from that of the test wiring, they may be applied to a configuration of other types of the thin film transistor or a display panel having a different shape.

That is, in the case of the OLED display device, the signal pad 210 and the test wiring portions 220 and 220' may be formed of a gate metal material (layer) or a source/drain metal material (layer), and the jumping wiring 230 may be formed of a material identical to that of a first electrode (anode or cathode) or a second electrode (cathode or anode), which are disposed on both ends of an organic light emitting layer. In addition, the jumping wiring 230 may be formed on a layer identical to that of the first electrode or the second electrode. Particularly, the jumping wiring 230 may be formed of a material identical to the first electrode or the second electrode consisting of a transparent conductive material, e.g., Indium-Tin-Oxide (ITO) or Indium-Zinc-Oxide (IZO), on a layer identical to that of the first electrode or the second electrode, according to a type, e.g., n type or p type, of a driving transistor (DTr) of the OLED substrate.

Further, although it is shown in FIGS. 2 to 4 that both the test wiring portions 220 and 220' and the signal pad 210 are formed of the gate metal layer, in the case the signal pad and the test wiring are for the data lines, the test wiring portions 220 and 220' and the signal pad 210 may be formed of a material identical to that of the source/drain metal layer shown in FIGS. 2 to 4 in a process identical to that of forming the source/drain metal layer.

In the first embodiment, although it is not shown, the auto probe test wiring portions 220 and 220' and the signal pad 210 may be simultaneously formed along with the source/drain metal layer, and the contact holes 240 may be formed to penetrate the protection layer 322 on the source/drain metal layer. Further, the jumping wiring 230 may be formed of a material identical to that of the pixel electrode in a process identical to that of forming the pixel electrode.

Figure 5:
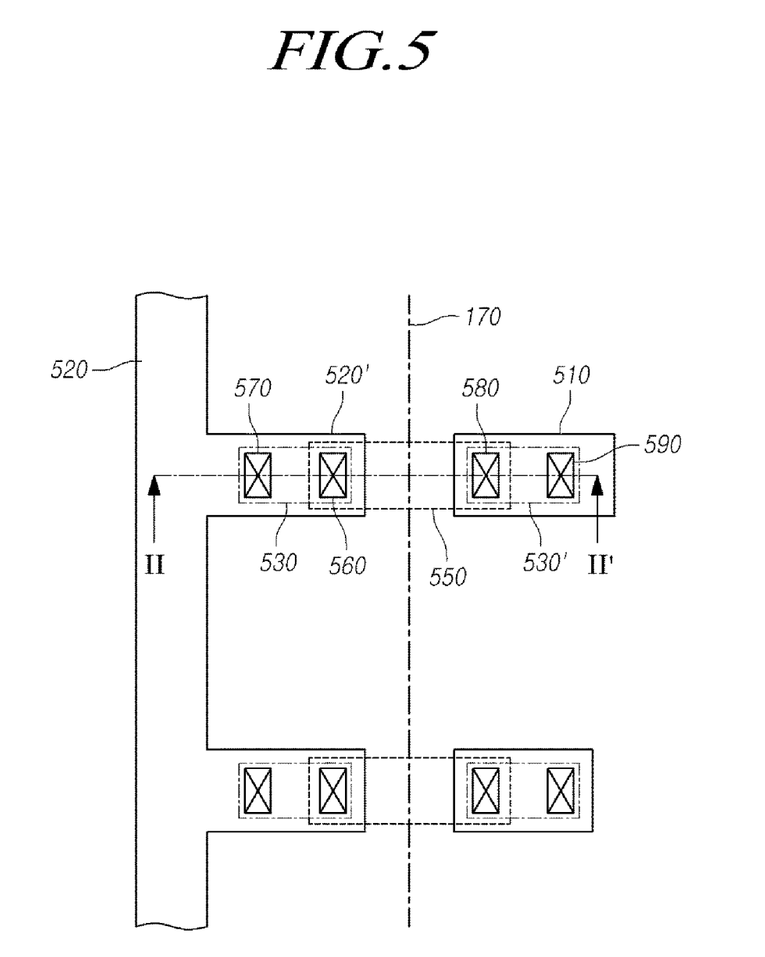
FIG. 5 is a plan view illustrating a test wiring portion on an array substrate according to the second embodiment.
Figure 6:
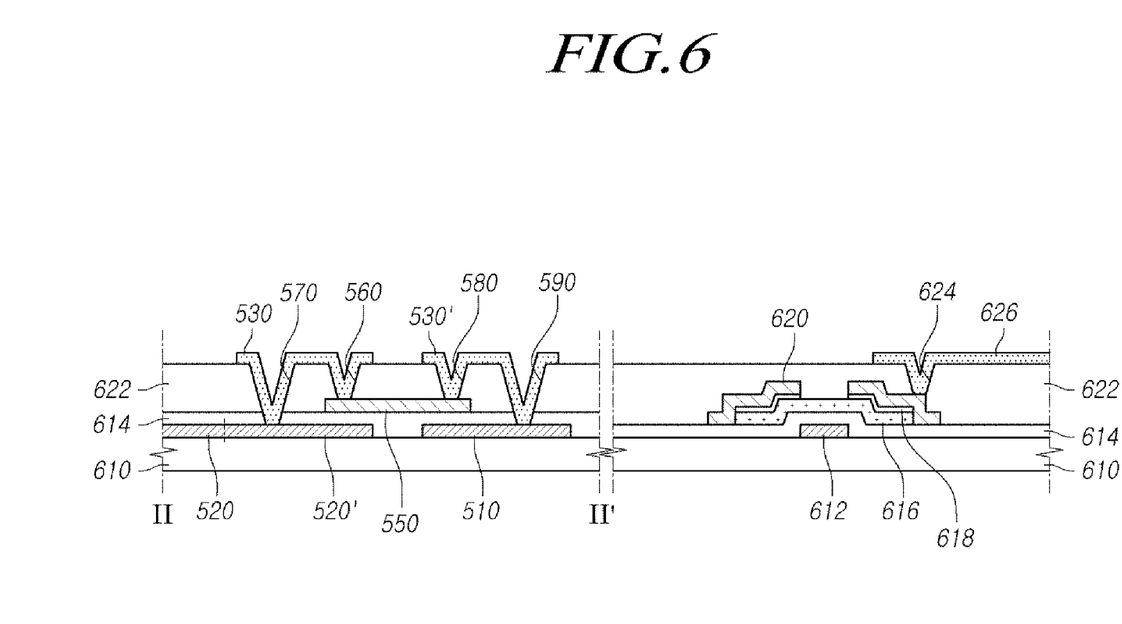
FIG. 6 is a sectional view illustrating the test wiring portion.
Figure 7:
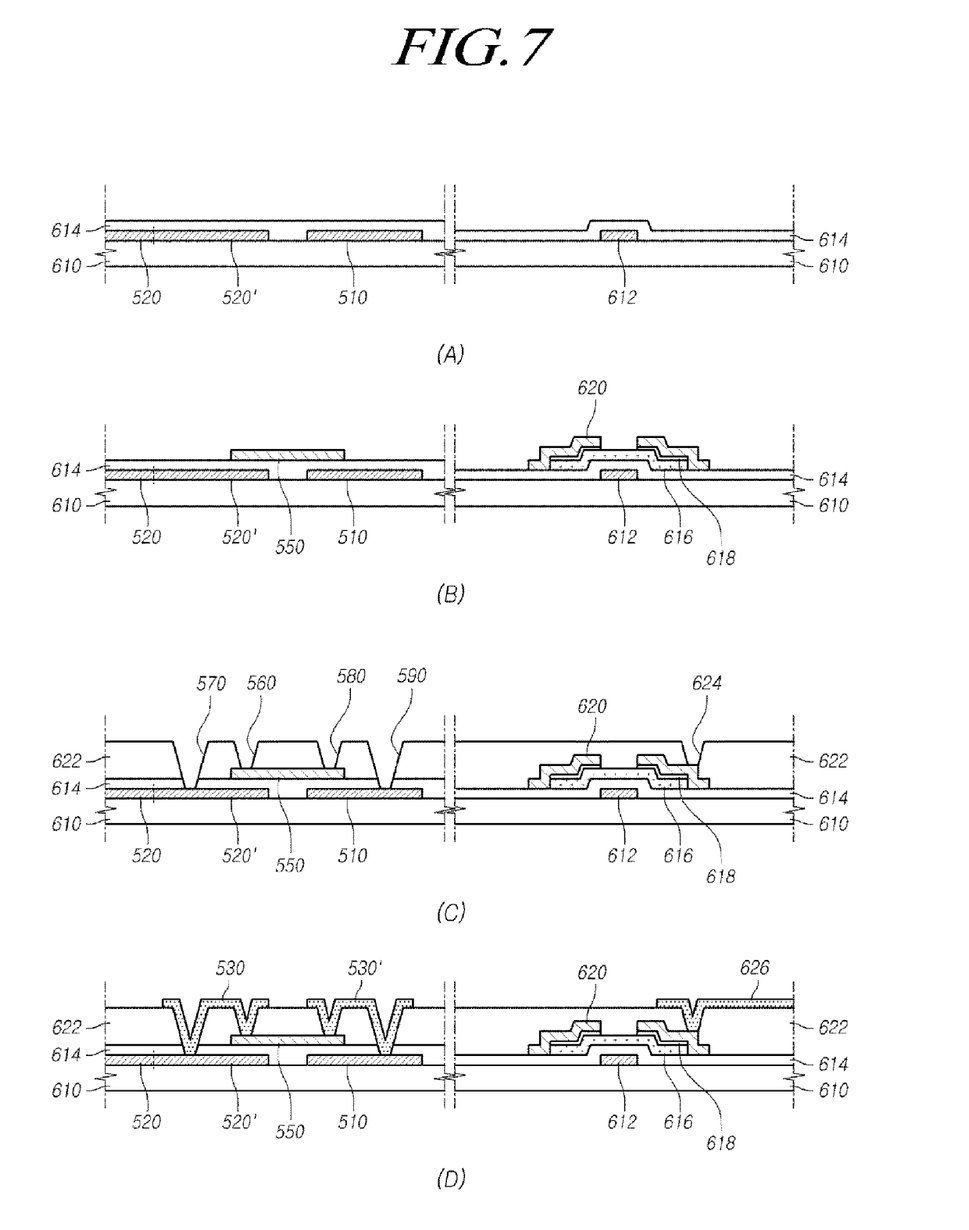
FIG. 7 is a view illustrating a fabricating process.

FIGS. 5, 6 and 7 are views illustrating a configuration of the second embodiment of the present invention, in which FIG. 5 is a plan view illustrating a test wiring portion on an array substrate according to the second embodiment of the present invention, FIG. 6 is a sectional view illustrating the test wiring portion, and 7 is a view illustrating a fabricating process.

According to the second embodiment shown in FIGS. 5, 6 and 7, the display panel includes (for example, similarly as illustrated in FIG. 1) an active area having a plurality of pixels each of which is defined at an intersection area between a gate line and a data line, a signal pad 510 arranged in a non-active area for applying a gate signal or a data signal to the gate line or the data line, and test wiring portions 520 and 520' which are arranged outside of the cutting line 170 and electrically connected to the signal pad in order to use in a test of the display panel. The display panel may include a connection wiring 550 interposed between the signal pad 510 and the test wiring portions 520 and 520', and formed of a material identical to that of the signal pad and the test wiring portions, and jumping wirings 530 and 530' which establish an electric connection between the connection wiring 550 and the test wiring portions 520, 520', and an electric connection between the connection wiring 550 and the signal pad 510, respectively, and which are formed of a material different from that of the signal pad and the test wiring portions on a layer different from that of the signal pad and the test wiring portions.

In the embodiment shown in FIGS. 5 to 7, the signal pad 510 and the test wiring portions 520 and 520' are formed of a gate metal layer, the connection wiring 550 is formed of a source/drain metal, and the jumping wirings 530 and 530' are formed of a material of a pixel electrode. The jumping wirings 530 and 530' may be electrically connected to the test wiring portions 520 and 520' and the signal pad 510, respectively, through first contact holes 570 and 590 formed to penetrate a gate insulation layer 614 and a protection layer 622 so as to expose a part of the test wiring portions 520 and 520' or the signal pad 510 and second contact holes 560 and 580 formed to penetrate the protection layer 622 so as to expose a part of the connection wiring 550.

That is, in the second embodiment, the signal pad 510 and the test wiring portions 520 and 520' are formed of the gate metal layer, and a connection wiring 550 of the source/drain metal layer which is the connection wiring between the signal pad 510 and the test wiring portions 520 and 520' is formed on another layer. The signal pad 510 and the test wiring portions 520 and 520' are connected to the connection wiring 550 by means of the jumping wirings 530 and 530' formed of a material of the pixel electrode.

FIG. 6 is a sectional view illustrating an area near the test wirings according to the second embodiment, in which a cross section of the thin film transistor is shown on a right side.

As shown on a left side of FIG. 6, according to the second embodiment, the display panel includes test wiring portions 520 and 520' and the signal pad 510, which are formed of a material identical to that of a gate electrode 612 of a thin film transistor in a process identical to that of forming the gate electrode 612, a connection wiring 550 formed of a material identical to that of a source/drain electrode 620 on a layer identical to that of the source/drain electrode 620, in which a gate insulation layer 614 is interposed between the connection wiring 550 and the test wiring portions 520 and 520' or the signal pad 510. The display panel further includes a jumping wiring 530 formed of a material different from that of the test wiring portions 520 and 520' and the connection wiring 550 and formed on a layer different from that of the test wiring portions 520 and 520' and the connection wiring 550, for electrically connecting the connection wiring 550 and the signal pad 510 with the test wiring portions 520 and 520'.

According to the second embodiment, in the case where static electricity is generated in a process of testing the panel, such as an array test and the like, when an electric charge of static electricity reaches the jumping wiring 530 consisting of a heterogeneous material (in other words, a material that is different from a material of the test wiring portions 520 and 520' and/or of the signal pad 510) while it is electrified through the test wiring portions 520 and 520', a movement of the electric charge is disturbed due to a difference of electric conductivity, and a connection of two materials is broken due to a difference of mobility of the electric charge, so as to cause a phenomenon in which two materials are electrically short-circuited. Accordingly, it is possible to prevent an inflow of the static electricity into the panel through the test wiring portions.

FIG. 7 is a view illustrating a process of fabricating an array substrate having a configuration capable of preventing static electricity according to the second embodiment of the present invention.

Firstly, a gate metal material consisting of a metal material with low electrical resistance including at least one of aluminum (Al), aluminum alloy such as aluminum neodym alloy (AlNd), copper (Cu), copper alloy, molybdenum (Mo), and molybdenum alloy such as molybdenum titanium alloy (MoTi), is deposited and patterned on a surface of a transparent insulation substrate 610 formed of a glass or plastic material, thereby forming the test wiring portions 520 and 520' and the signal pad 510.

In the process, a gate line (not shown) connected to each pixel area and a gate electrode 612 of a driving TFT or a pixel TFT may be simultaneously formed together.

A gate insulation layer 614 consisting of an insulation substance is formed on the substrate 610 on which the gate electrode 512, the test wiring portions 520 and 520', and the signal pad 510 are formed (see step A of FIG. 7).

Next, in the process of forming a source/drain electrode 620 on a semiconductor layer 616 and an ohmic contact layer 618 after forming the semiconductor layer 616 and the ohmic contact layer 618 on the gate insulation layer 614 in the form of an island, a connection wiring 550 made of a source/drain metal material is formed between the inspection pad 520' and the signal pad 510 in a thin film transistor area (See step B of FIG. 7).

In this event, the connection wiring 550 may be formed so that both ends thereof partially overlap ends of the inspection pad 520' and the signal pad 510, respectively.

The process of forming the semiconductor layer 616 and the ohmic contact layer 618, and the use of the etch stopper instead of the formation of the semiconductor layer 616, correspond to the description related to the first embodiment, and thus the detailed description of the process and the use of the etch stopper will be omitted to avoid a duplicate description.

Next, a protection layer 622 is formed on a surface of the substrate on which a source/drain electrode 620 of a thin film transistor area and a connection wiring of a test wiring area, and a contact hole 624 is formed to penetrate the protection layer 622 so as to expose a part of the drain electrode of the thin film transistor area in order to connect the pixel electrode. In the process, the gate insulation layer 614 and the protection layer 622, which are arranged on ends of the inspection pad 520' and the signal pad 510, are partially etched to form first contact holes 570 and 590 through which a part of the inspection pad 520' and the signal pad 510 is exposed. Furthermore, a part of the protection layer 522 located on both ends of the connection wiring 550 is partially etched to form second contact holes 560 and 580 through which a part of both ends of the connection wiring 550 is exposed (see step C of FIG. 7).

Then, in the process of forming the pixel electrode 626 connected to the drain electrode in the thin film transistor area, a jumping wiring 530 and a jumping wiring 530' are formed in the test wiring area, which electrically connect ends of the inspection pad 520' and the signal pad 510, respectively, to both ends of the connection wiring 550. Such jumping wirings 530, 530' may be formed of a material identical to that of the pixel electrode, i.e., a transparent conductive material having a relatively large work function value, for example, a metal oxide such as Indium-Tin-Oxide (ITO) or Indium-Zinc-Oxide (IZO), a combination of a metal and an oxide, such as ZnO:Al or SnO2:Sb, and the like (see step D of FIG. 7).

Further, in the second embodiment shown in FIGS. 5, 6, and 7, it is described as an example that the test wiring portions 520 and 520' and the signal pad 510 are formed of a gate metal layer, and the connection wiring 550 is formed of a source/drain metal layer, but the second embodiment is not limited thereto. In the second embodiment, the test wiring portions and the signal pad may be formed of the source/drain metal layer, and the connection wiring may be formed of the gate metal layer.

Figure 8A:
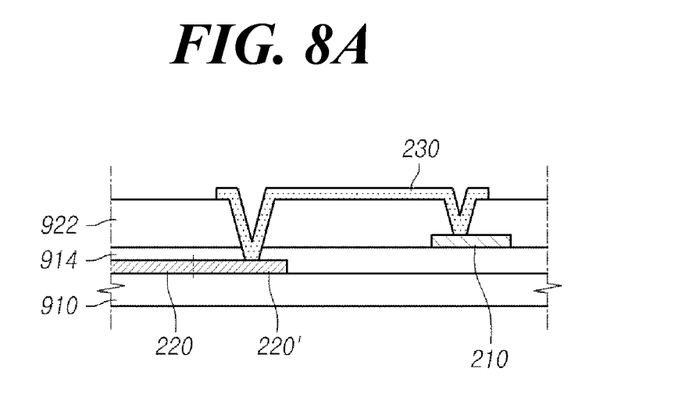
FIGS. 8A and 8B are views illustrating modifications of the first and second embodiments.
Figure 8B:
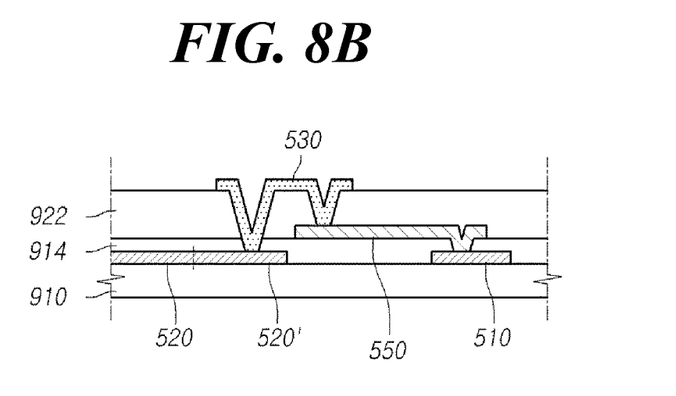

FIGS. 8A and 8B are views illustrating modifications of the first and second embodiments of the present invention.

FIG. 8A shows a modification of the first embodiment. In the first embodiment shown in FIGS. 2, 3 and 4, it is described that the test wiring portions 220 and 220' and the signal pad 210 are formed on an identical layer (a gate layer or a source/drain layer). However, as shown in FIG. 8A, the test wiring portions 220 and 220' and the signal pad 210 may be formed on different layers, respectively.

For example, as shown in FIG. 8A, the test wiring portions 220 and 220' are formed of a material identical to that of the gate metal layer on a layer identical to that of the gate metal layer, and the signal pad 210 is formed of a material identical to that of the source/drain metal layer on a layer identical to that of the source/drain metal. The jumping wiring 230 interposed between the test wiring portions 220 and 220' and the signal pad 210 may be formed of a material identical to that of the pixel electrode on a layer identical to that of the pixel electrode. In another example, the test wiring portions 220 and 220' may be formed of the source/drain metal layer, and the signal pad 210 may be formed of the gate metal layer.

FIG. 8B shows a modification of the second embodiment. Although it is described that the jumping wirings 530 and 530' are formed at both ends of the connection wiring 550 in the embodiment shown in FIGS. 5, 6 and 7, the embodiment is not limited thereto. As shown in FIG. 8B, the jumping wiring may be formed only at one end of the connection wiring 550.

For example, as shown in FIG. 8B, both the test wiring portions 520 and 520' and the signal pad 510 may be formed of the gate metal layer, and the connection wiring 550 may be formed of the source/drain metal layer. One side or end of the connection wiring 550 may be directly connected to the signal pad 510 through a contact hole which penetrates a gate insulation film 914 and, at the other side-part or end of the connection wiring 550, the jumping wiring 530 made of a material of the pixel electrode may be formed through a first contact hole formed to penetrate the gate insulation film 914 and the protection layer 922 arranged on the inspection pad 520' and a second contact hole formed to penetrate the gate insulation film 914 arranged on the other side or end of the connection wiring 550. In another example, the inspection pad 520' may be directly connected to a side or end of the connection wiring 550, and the signal pad 510 and the other side or end of the connection wiring 550 may be connected by means of the jumping wiring 530.

As described above, according to the embodiments of the present invention, while static electricity generated in an array test process of the display panel of the liquid crystal display device or the organic light emitting display device flows into the panel, a discharge of the static electricity is induced at a connection of the jumping wiring formed of a material different from that of the test wiring or the signal pad. Accordingly, there is an advantage in that the panel is prevented from being damaged due to the inflow of the static electricity generated in the array test process into the panel.

It will be apparent to those skilled in the art that various modifications and variations can be made in the display panel of the present invention without departing from the spirit or scope of the invention. Thus, it is intended that the present invention cover the modifications and variations of this invention provided they come within the scope of the appended claims and their equivalents.

What is claimed is:

1. A display panel, comprising:
  a plurality of gate lines and data lines;
  an active area having a plurality of pixels, each of which is defined at an intersection area between a respective gate line and data line;
  a plurality of signal pads arranged in a non-active area, each signal pad configured so as to apply a gate signal or a data signal to a respective gate line or data line;
  a test wiring portion arranged opposite to the active area relative to a cutting line of the display panel, the test wiring portion electrically connected to the plurality of signal pads in order to be used in a test of the display panel;
  a plurality of jumping wirings, each jumping wiring being interposed between a respective signal pad and the test wiring portion and electrically connecting the signal pad with the test wiring portion,
  the jumping wirings being formed of a material different from that of the signal pads and the test wiring portion, and the jumping wirings being on a layer different from that of the signal pads and the test wiring portion,
wherein the signal pads and the test wiring portion are formed of a gate metal material or a source/drain metal material, and the jumping wirings are formed of a material of a pixel electrode.

2. The display panel of claim 1, wherein each of the signal pads is configured as a gate pad so as to apply a gate signal to a respective gate line.

3. The display panel of claim 1, wherein each jumping wiring is configured such that a connection of the jumping wiring with one of the signal pad and the test wiring portion breaks down due to a heterogeneous material therebetween when static electricity generated in a process of testing the display panel flows into the display panel, so as to prevent damage of the display panel.

4. The display panel of claim 1, wherein the signal pads and the test wiring portion are formed of at least one of aluminum, aluminum alloy, copper, copper alloy, molybdenum, and molybdenum alloy, and the jumping wirings are formed of a metal oxide which is one of Indium-Tin-Oxide and Indium-Zinc-Oxide, or a combination of a metal and an oxide which is one of ZnO:Al and SnO2:Sb.

5. A display panel, comprising:
a plurality of gate lines and data lines;
an active area having a plurality of pixels, each of which is defined at an intersection area between a respective gate line and data line;
a plurality of signal pads arranged in a non-active area, each signal pad configured so as to apply a gate signal or a data signal to a respective gate line or data line;
a test wiring portion arranged opposite to the active area relative to a cutting line of the display panel, the test wiring portion electrically connected to the plurality of signal pads in order to be used in a test of the display panel;
a plurality of jumping wirings, each jumping wiring being interposed between a respective signal pad and the test wiring portion and electrically connecting the signal pad with the test wiring portion,
the jumping wirings being formed of a material different from that of the signal pads and the test wiring portion, and the jumping wirings being on a layer different from that of the signal pads and the test wiring portion,
wherein the display panel is an OLED display panel including an organic light emitting device, the signal pads and the test wiring portion are formed of a gate metal material or a source/drain metal material, and the jumping wirings are formed of a material identical to that of a first electrode or a second electrode, which are arranged on opposite sides of an organic light emitting layer, and
the jumping wirings are on a layer identical to that of the first electrode or the second electrode, wherein the first electrode is an anode and the second electrode is a cathode.

6. The display panel of claim 1, wherein the jumping wiring has a length longer than 500 μm.

7. A display panel, comprising:
a plurality of gate lines and data lines;
an active area having a plurality of pixels, each of which is defined at an intersection area between a respective gate line and data line;
a plurality of signal pads arranged in a non-active area, each signal pad configured so as to apply a gate signal or a data signal to a respective gate line or data line;
a test wiring portion arranged opposite to the active area relative to a cutting line of the display panel, the test wiring portion electrically connected to the plurality of signal pads in order to be used in a test of the display panel;
a plurality of jumping wirings, each jumping wiring being interposed between a respective signal pad and the test wiring portion and electrically connecting the signal pad with the test wiring portion; and
a plurality of connection wirings, each connection wiring being interposed between a respective signal pad and the test wiring portion and formed of a material identical to that of the signal pad and the test wiring portion,
wherein in each case the jumping wiring forms a connection at least one of between the signal pad and the connection wiring and between the test wiring portion and the connection wiring.

8. The display panel of claim 7, wherein the signal pads, the test wiring portion, and the connection wiring are formed of a gate metal material or a source/drain metal material, and the jumping wirings are formed of a material of a pixel electrode.

9. The display panel of claim 8, wherein the signal pads, the test wiring portion, and the connection wirings are formed of at least one of aluminum, aluminum alloy, copper, copper alloy, molybdenum, and molybdenum alloy, and the jumping wirings are formed of a metal oxide which is one of Indium-Tin-Oxide (ITO) and Indium-Zinc-Oxide (IZO), or a combination of a metal and an metal oxide which is one of ZnO:Al and SnO2:Sb.

10. The display panel of claim 7, wherein the display panel is an OLED display panel including an organic light emitting device, the signal pads, the test wiring portion, and the connection wirings are formed of a gate metal material or a source/drain metal material, and the jumping wiring is formed of a material identical to that of a first electrode or a second electrode, which are arranged on opposite sides of an organic light emitting layer, and the jumping wiring is on a layer identical to that of the first electrode or the second electrode, wherein the first electrode is an anode and the second electrode is a cathode.

11. The display panel of claim 1, wherein the signal pads and the test wiring portion are formed of the same material and are on the same layer.

12. The display panel of claim 1, wherein the signal pads are formed of a different material and are on a different layer than the test wiring portion.

* * * * *